(12) United States Patent
Dong et al.

(10) Patent No.: US 12,538,718 B2
(45) Date of Patent: Jan. 27, 2026

(54) SEMICONDUCTOR DEVICE AND METHOD FOR FABRICATING THE SAME

(71) Applicant: SK hynix Inc., Icheon-si (KR)

(72) Inventors: Cha Deok Dong, Icheon-si (KR); Keo Rock Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 406 days.

(21) Appl. No.: 18/344,723

(22) Filed: Jun. 29, 2023

(65) Prior Publication Data

US 2024/0237562 A1    Jul. 11, 2024

(30) Foreign Application Priority Data

Jan. 11, 2023    (KR) .................... 10-2023-0004041

(51) Int. Cl.
*H10N 70/00*    (2023.01)
*H10B 63/00*    (2023.01)

(52) U.S. Cl.
CPC ........... *H10N 70/841* (2023.02); *H10B 63/84* (2023.02); *H10N 70/883* (2023.02)

(58) Field of Classification Search
CPC .. H10N 70/841; H10N 70/883; H10N 70/826; H10N 70/011; H10N 79/00; H10B 63/84; H10B 63/20; H10B 63/24; H10B 63/30
See application file for complete search history.

(56) References Cited

U.S. PATENT DOCUMENTS

| | | | |
|---|---|---|---|
| 7,067,862 B2 * | 6/2006 | Rinerson ............ | H10N 70/8836 257/295 |
| 10,658,588 B2 | 5/2020 | Yasuda et al. | |
| 2021/0134884 A1 | 5/2021 | Lee et al. | |

\* cited by examiner

*Primary Examiner* — David Vu
(74) *Attorney, Agent, or Firm* — Perkins Coie LLP

(57) ABSTRACT

Semiconductor devices and methods for fabricating semiconductor devices are disclosed. In some implementations, a semiconductor device may include a first electrode layer; a second electrode layer disposed over the first electrode layer and spaced apart from the first electrode layer; and a selector layer disposed between the first electrode layer and the second electrode layer and including an insulating material that contains at least a dopant and carbon, wherein a carbon concentration at a first portion of the selector layer adjacent to the second electrode layer is higher than a carbon concentration at a second portion of the selector layer adjacent to the first electrode layer.

10 Claims, 8 Drawing Sheets

SEMICONDUCTOR DEVICE AND METHOD FOR FABRICATING THE SAME

PRIORITY CLAIM AND CROSS-REFERENCE TO RELATED APPLICATION

This patent document claims the priority and benefits of Korean Patent Application No. 10-2023-0004041, filed on Jan. 11, 2023, which is incorporated herein by reference in its entirety.

TECHNICAL FIELD

This patent document relates to integrated circuit designs and their applications in semiconductor devices or systems including memory circuits or devices.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document relates to memory circuits or devices and their applications in semiconductor devices or systems. A semiconductor device implemented based on some embodiments of the disclosed technology can improve the performance of a semiconductor device and reduce manufacturing defects.

In one aspect, a semiconductor device implemented based on some embodiments of the disclosed technology may include: a first electrode layer; a second electrode layer disposed over the first electrode layer and spaced apart from the first electrode layer; and a selector layer interposed or disposed between the first electrode layer and the second electrode layer and including an insulating material that contains at least a dopant and carbon, wherein a carbon concentration at a first portion of the selector layer adjacent to the second electrode layer is higher than a carbon concentration at a second portion of the selector layer adjacent to the first electrode layer.

In another aspect, a method for fabricating a semiconductor device implemented based on some embodiments of the disclosed technology may include: forming a first electrode layer over a substrate and forming a selector layer over the first electrode layer; forming a carbon layer over the selector layer such that carbon is diffused into at least part of the selector layer; performing a radical oxidation process on the carbon layer and removing at least part of the carbon layer by the radical oxidation process; and forming a second electrode layer over the selector layer from which the at least part of the carbon layer has been removed, wherein a carbon concentration at a first portion of the selector layer adjacent to the second electrode layer is higher than a carbon concentration at a second portion of the selector layer adjacent to the first electrode layer.

The above and other aspects of the disclosed technology are disclosed in the drawings, the detailed description and the claims.

DETAILED DESCRIPTION

Figure 1A:
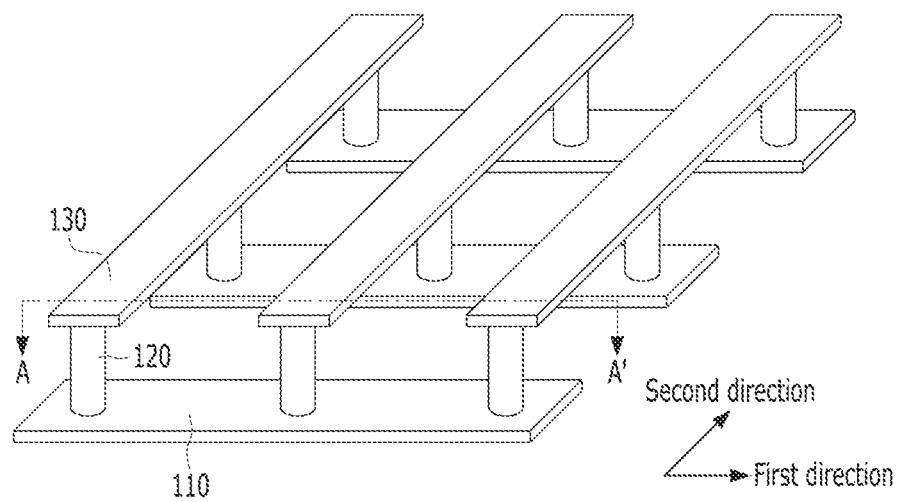
FIGS. 1A and 1B illustrate an example of a semiconductor device based on some implementations of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
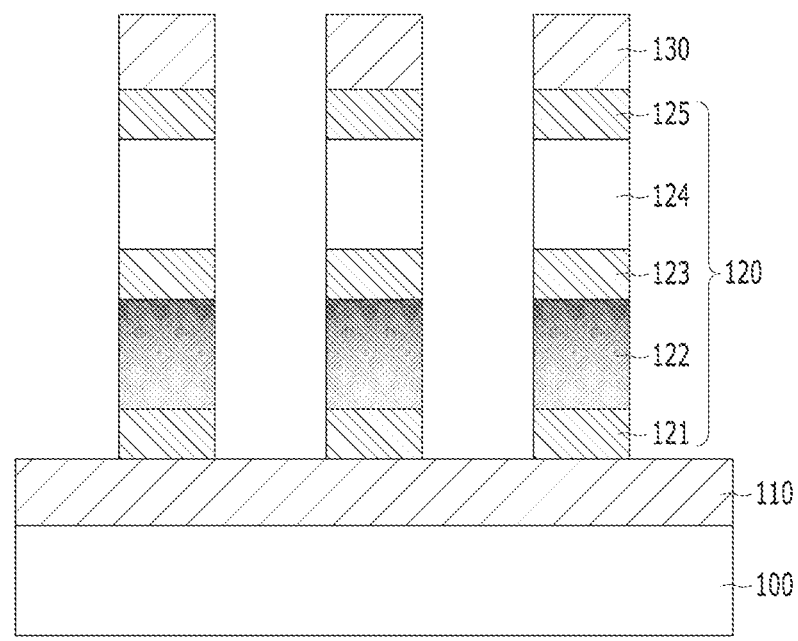

FIGS. 1A and 1B illustrate a semiconductor device based on some implementations of the disclosed technology. FIG. 1A is a perspective view, and FIG. 1B is a cross-sectional view taken along line A-A' of FIG. 1A.

Referring to FIGS. 1A and 1B, the semiconductor device may include a cross-point structure including a substrate 100, first conductive lines 110 formed over the substrate 100 and extending in a first direction, second conductive lines 130 formed over the first conductive lines 110 to be spaced apart from the first conductive lines 110 and extending in a second direction crossing the first direction, and memory cells 120 disposed at intersections of the first conductive lines 110 and the second conductive lines 130 between the first conductive lines 110 and the second conductive lines 130. In this patent document, the conductive lines can indicate conductive structures that electrically connect two or more circuit elements in the semiconductor device. In some implementations, the conductive lines include word lines that are used to control access to memory cells in the semiconductor device and bit lines that are used to read out information stored in the memory cells. In some implementations, the conductive lines include interconnects that carry signals between different circuit elements in the semiconductor device.

The substrate 100 may include a semiconductor material such as silicon. A required lower structure (not shown) may be formed in the substrate 100. For example, the substrate 100 may include a driving circuit (not shown) electrically connected to the first conductive lines 110 and/or the second conductive lines 130 to control operations of the memory cells 120. In this patent document, the conductive lines can indicate conductive structures that electrically connect two or more circuit elements in the semiconductor device. In some implementations, the conductive lines include word lines that are used to control access to memory cells in the semiconductor device and bit lines that are used to read out information stored in the memory cells. In some implementations, the conductive lines include interconnects that carry signals between different circuit elements in the semiconductor device.

The first conductive lines 110 and the second conductive lines 130 may be connected to a lower end and an upper end of the memory cell 120, respectively, and may provide a voltage or a current to the memory cell 120 to drive the memory cell 120. When the first conductive lines 110 functions as a word line, the second conductive lines 130 may function as a bit line. Conversely, when the first conductive lines 110 functions as a bit line, the second conductive lines 130 may function as a word line. The first conductive lines 110 and the second conductive lines 130 may include a single-layered structure or a multi-layered structure including one or more of various conductive materials. Examples of the conductive materials may include a metal, or a metal nitride, or a conductive carbon material, or a combination thereof, but are not limited thereto. For example, the first conductive lines 110 and the second conductive lines 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix or array having rows and columns along the first direction and the second direction so as to overlap the intersection regions between the first conductive lines 110 and the second conductive lines 130. In an implementation, each of the memory cells 120 may have a size that is substantially equal to or smaller than a size of the intersection region between each corresponding pair of the first conductive lines 110 and the second conductive lines 130. In another implementation, each of the memory cells 120 may have a size that is larger than a size of the intersection region between each corresponding pair of the first conductive lines 110 and the second conductive lines 130.

In some implementations, the memory cell 120 may have a cylindrical shape, but the shape of the memory cell 120 is not limited thereto. In some implementations, the memory cell 120 may have a square pillar shape.

Spaces between the first conductive lines 110, the second conductive lines 130 and the memory cell 120 may be filled with an insulating material.

The memory cell 120 may include a stacked structure including a lower electrode layer 121, a selector layer 122, a middle electrode layer 123, a variable resistance layer 124 and an upper electrode 125.

The selector layer 122 may serve to select or control access to the variable resistance layer 124 and prevent a current leakage between the memory cells 120 sharing the first line 110 or the second line 130. To this end, the selector layer 122 may be structured to exhibit a threshold switching characteristic that blocks or substantially limits a current when a magnitude of an applied voltage to the selector layer 122 is less than a predetermined threshold value and allows the current flowing through the selector layer 122 to increase rapidly when the magnitude of the applied voltage is equal to or greater than the predetermined threshold value. This threshold value may be referred to as a threshold voltage, and the selector layer 122 may be in either a turned-on or "on" state, which corresponds to an electrically high conductive state, or a turned-off or "off" state, which corresponds to an electrically low conductive state or an electrically non-conductive state, depending on whether the applied voltage is above or below the threshold voltage. Thus, the selector layer 122 exhibits different electrically conductive states to provide a switching operation to switch between the different electrically conductive states by controlling the applied voltage relative to the threshold voltage. The selector layer 122 may include Metal Insulator Transition (MIT) material such as $NbO_2$, $TiO_2$, $VO_2$, $WO_2$, or others, Mixed Ion-Electron Conducting (MIEC) material such as $ZrO_2(Y_2O_3)$, $Bi_2O_3$—$BaO$, $(La_2O_3)_x(CeO_2)_{1-x}$, or others, Ovonic Threshold Switching (OTS) material including chalcogenide material such as $Ge_2Sb_2Te_5$, $As_2Te_3$, $As_2$, $As_2Se_3$, or others, or a tunneling insulating material such as silicon oxide, silicon nitride, a metal oxide, or others. A thickness of the tunneling insulating layer is sufficiently small to allow tunneling of electrons through the tunneling insulating layer under a given voltage or a given current. The selector layer 122 may include a single-layered structure or a multi-layered structure.

In some implementations, the selector layer 122 may perform a threshold switching operation through a doped region formed in a material layer or a selector material layer that becomes the selector layer 122. Thus, a size of the threshold switching operation region may be controlled by a distribution area of the dopants. The dopants may form trap sites for capturing charge carriers in the material layer for the selector layer 122. The trap sites may capture the charge carriers moving in the selector layer 122 based on an external voltage applied to the selector layer 122. The trap sites thereby provide a threshold switching characteristic and are used to perform a threshold switching operation.

In some implementations, the selector layer 122 may include a dielectric material having incorporated dopants. The selector layer 122 may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the selector layer 122 may include an n-type dopant or a p-type dopant and be incorporated for example, by ion implantation process. Examples of the dopants may include one or more of boron (B), nitrogen (N), carbon (C), phosphorous (P), arsenic (As), aluminum (Al), silicon (Si) or germanium (Ge). For example, the selector layer 122 may include As-doped silicon oxide or Ge-doped silicon oxide.

The variable resistance layer 124 may be used to store data by representing different digital data using its different resistance states and can be operated to switch between the different resistance states in response to an applied voltage or current. The variable resistance layer 124 may have a single-layered structure or a multi-layered structure including at least one of variable resistance materials having a variable resistance characteristic used for an RRAM, a PRAM, an MRAM, an FRAM, and others. For example, the variable resistance layer 124 may include a metal oxide such as a transition metal oxide or a perovskite-based oxide, a phase change material such as a chalcogenide-based material, a ferromagnetic material, a ferroelectric material, or others. However, the implementations are not limited thereto, and the memory cell 120 may include other variable resistance layers capable of storing data in various ways instead of the variable resistance layer 124.

In some implementations, the variable resistance layer 124 may include an MTJ structure including a free layer having a variable magnetization direction, a pinned layer having a fixed or "pinned" magnetization direction and a tunnel barrier layer interposed between the free layer and the pinned layer.

The free layer in the MTJ structure may switch its polarity by changing its magnetization direction or its electron spin direction, thereby changing its resistance value. In some implementations, the polarity of the free layer is changed or flipped upon application of a voltage or current signal (e.g., a driving current above a certain threshold) to the MTJ structure. With the polarity changes of the free layer, the free layer and the pinned layer have different magnetization directions or different electron spin directions, which allows the variable resistance layer 124 to store or represent different data bits. The free layer may also be referred as a storage layer. In one example, the magnetization direction of the free layer may be substantially perpendicular to a surface of the free layer, the tunnel barrier layer and the pinned layer. In other words, the magnetization direction of the free layer may be substantially parallel to the direction in which the free layer, the tunnel barrier layer and the pinned layer are stacked. Therefore, in this example, the magnetization direction of the free layer may switch between a downward direction and an upward direction. The change in the magnetization direction of the free layer may be induced by a spin transfer torque generated by an applied current or voltage.

The pinned layer may have a fixed or "pinned" magnetization direction, which remains unchanged while the magnetization direction of the free layer changes. The pinned layer may be referred to as a reference layer. In some implementations, the magnetization direction of the pinned layer may be fixed or "pinned" in a downward direction. In some implementations, the magnetization direction of the pinned layer may be fixed or "pinned" in an upward direction.

The free layer and the pinned layer may have a single-layered structure or a multi-layered structure including a ferromagnetic material. For example, the pinned layer may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

The tunnel barrier layer may allow the tunneling of electrons in both data reading and data writing operations. The tunnel barrier layer may include a dielectric oxide such as MgO, CaO, SrO, TiO, VO, or NbO or others.

If a voltage or current is applied to the variable resistance layer 124, the magnetization direction of the free layer may switch between a downward direction and an upward direction by spin transfer torque. In some implementations, when the magnetization directions of the free layer and the pinned layer are parallel to each other, the variable resistance layer 124 may be in a low resistance state, and this may indicate digital data bit "0." Conversely, when the magnetization directions of the free layer and the pinned layer are anti-parallel to each other, the variable resistance layer 124 may be in a high resistance state, and this may indicate a digital data bit "1." In some implementations, the variable resistance layer 124 can be configured to store data bit '1' when the magnetization directions of the free layer and the pinned layer are parallel to each other and to store data bit '0' when the magnetization directions of the free layer and the pinned layer are anti-parallel to each other.

In some implementations, the variable resistance layer 124 may further include one or more layers performing various functions to improve a characteristic of the MTJ structure. For example, the variable resistance layer 124 may further include at least one of a buffer layer, an under layer, a spacer layer, a magnetic correction layer, and a capping layer.

The lower electrode layer 121 may be interposed between the first conductive line 110 and the selector layer 122 and disposed at a lowermost portion of each of the memory cells 120. The lower electrode layer 121 may function as a circuit node that carries a current or applies a voltage between one of the first conductive lines 110 and the remaining portion (e.g., the elements 122, 123, 124, and 125) of each of the memory cells 120. The upper electrode layer 125 may be disposed at an uppermost portion of the memory cell 120 and function as a transmission path of electrical signals such as a voltage or a current between a material layer in the memory cell 120 and one of the second conductive lines 130.

The lower electrode layer 121 and the upper electrode layer 125 may include a single-layered structure or a multi-layered structure including various conductive materials such as a metal, a metal nitride, a conductive carbon material, or a combination thereof, respectively. For example, the lower electrode layer 121 and the upper electrode layer 125 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof.

The lower electrode layer 121 and the upper electrode layer 125 may include the same material as each other or different materials from each other.

The lower electrode layer 121 and the upper electrode layer 125 may have the same thickness as each other or different thicknesses from each other.

In some implementations, the memory cell 120 may be formed without including at least one of the lower electrode layer 121 or the upper electrode layer.

The middle electrode layer 123 may be interposed between the selector layer 122 and the variable resistance layer 124. The middle electrode layer 123 may electrically connect the selector layer 122 and the variable resistance layer 124 to each other while physically isolating or separating the selector layer 122 and the variable resistance layer 124 from each other.

In order to form a high-density cross-point memory cell array, a selector layer and a variable resistance layer may be formed at a lower portion and an upper portion of the same element. Since the variable resistance layer and the selector layer may include very sensitive materials that can determine basic characteristics of a memory cell, their characteristics are frequently deteriorated due to subsequent processes of an influence of other adjacent thin films. For example, when the variable resistance layer includes an MTJ, magnetic properties of the variable resistance layer may be deteriorated due to element diffusion caused by depositing a thin film. In addition, when the selector layer includes an insulating material doped with a dopant, it may be difficult to secure desired characteristics due to the loss of the dopant or exhibits structural instability due to an influence from subsequent processes. In order to address these issues, electrodes can be formed using various materials or an interface can be reinforced. As one example, a carbon electrode can be formed between the selector layer and the variable resistance layer. In this case, the selector layer can have improved properties because of the diffusion of carbon into the selector layer, but the properties of the variable resistance layer may be deteriorated because, during a patterning process of the memory cell, carbon is etched and moved to the variable resistance layer or redeposited on the variable resistance layer. In addition, due to the rough surface of the carbon electrode, crystal growth of the variable resistance layer may be hindered, and thus a planarization process may be required. To this end, a chemical mechanical planarization (CMP) process or an etchback process may be performed using an ion beam etch (IBE) process. However, "since both processes may cause stresses to the selector layer and the variable resistance layer, an unstable structure of the selector layer including the dopant-doped insulating material may be damaged, and lifting or peeling of the selector layer may occur. Therefore, it may be difficult to use the carbon electrode in a structure in which the selector layer and the variable resistance layer are formed at the lower portion and the upper portion of the same element.

In some implementations, such issues can be addressed by forming a carbon layer on a material layer that will become the selector layer 122 and removing the carbon layer by a radical oxidation process, in order to benefit from a positive effect of carbon on the selector layer 122 while avoiding a negative effect of the variable resistance layer 124 that can be deteriorated when the carbon remains as a film. In some implementations, after the material layer for the selector layer 122 is formed, the carbon layer is formed on the selector layer 122, so that the carbon may be diffused into the material layer for the selector layer 122. The carbon layer may be formed by performing a physical vapor deposition (PVD) process for diffusing carbon into the material layer. Thus, it is possible to decrease an effective thickness of the selector layer 122 by the diffusion of carbon, reduce an initial resistance value ($R_{ini}$) and a hold current ($I_{hold}$), and improve the switching characteristics of the selector layer 122. As a result, characteristics of the selector layer 122 can be improved. Further, before patterning the memory cell 120, the radical oxidation process is applied to the carbon layer to remove the carbon layer by generating CO (gas) and $CO_2$ (gas) via a reaction between C and O*. After removing the carbon layer, the middle electrode layer 123, which is advantageous to characteristics of the variable resistance layer 124, can be formed. Accordingly, it is possible to prevent the variable resistance layer 124 from being deteriorated due to the carbon layer existing as a film and the characteristics of the variable resistance layer 124 may be improved by the middle electrode layer 123. In addition, since the carbon layer is removed by the radical oxidation process, there is no need to perform a CMP or etchback process and no physical stress is applied to the structurally unstable selector layer 122. Thus, it is possible to prevent the selector layer 122 from being lifted or peeled. Further, during the radical oxidation process, oxygen radicals may penetrate the unstable structure of the selector layer 122 and form a bond with a dangling bond, resulting in a more structurally stable selector layer 122.

In some implementations, the selector layer 122 may include an insulating material with a dopant and carbon diffused therein. Carbon may be diffused throughout the selector layer 122. A concentration of carbon at a portion of the selector layer 122 adjacent to the middle electrode layer 123 may be higher than a concentration of carbon at a portion of the selector layer 122 adjacent to the lower electrode 121. That is, a concentration gradient of carbon may exist in the selector layer 122, and the carbon concentration of an upper part of the selector layer 122 may be higher than the carbon concentration of a lower part of the selector layer 122. In some implementations, the selector layer 122 may include an oxide doped with As or Ge. Carbon diffused into the selector layer 122 may serve to improve the characteristics of the selector layer 122. In addition, the selector layer 122 may include a bond between a dangling bond and an oxygen radical.

Figure 2A:
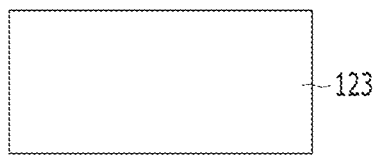
FIGS. 2A and 2B illustrate an example of a middle electrode based on some implementations of the disclosed technology.
Figure 2B:
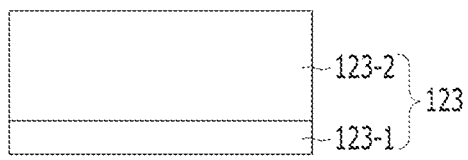

FIGS. 2A and 2B illustrate an example of the middle electrode 123 based on some implementations of the disclosed technology.

The middle electrode layer 123 may include a single-layered structure or a multi-layered structure including a metal, or a metal nitride, or a combination thereof. The middle electrode layer 123 may not include carbon. For example, the middle electrode layer 123 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof. In some implementations, the middle electrode layer 123 may include TiN.

The middle electrode layer 123 shown in FIG. 2A may be formed by: forming a material layer for the selector layer 122; forming a carbon layer over the material layer; removing the carbon layer by a radical oxidation process; forming a material layer for the middle electrode layer 123; and performing subsequent processes. Here, the subsequent processes may include forming a material layer for the variable resistance layer 124 and a material layer for the upper electrode layer 125, and patterning the material layers to form the memory cell 120. In some implementations, during the radical oxidation, the carbon layer may not be completely removed and may remain with a very thin thickness, as will be described with reference to FIG. 2B.

Referring to FIG. 2B, the middle electrode layer 123 may include a first middle electrode layer 123-1 and a second middle electrode layer 123-2.

The first middle electrode layer 123-1 may be derived from the carbon layer remaining with a fine thickness during the radical oxidation process. That is, the first middle electrode layer 123-1 may include carbon. The first middle electrode layer 123-1 may not include a conductive material other than carbon. A thickness of the first middle electrode layer 123-1 may be a thickness such that, even if carbon remains as a film, carbon does not move to the variable resistance layer 124 or is not redeposited on the variable resistance layer 124. In some implementations, the first middle electrode layer 123-1 may have a thickness greater than 0 nm and less than or equal to 5 nm.

The second middle electrode layer 123-2 may include a single-layered structure or a multi-layered structure including a metal, or a metal nitride, or a combination thereof. The second middle electrode layer 123-2 may not include carbon. For example, the second middle electrode layer 123-2 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof. In some implementations, the second middle electrode layer 123-2 may include TiN.

As shown in FIG. 2B, even when the carbon layer remains as a thin film, that is, the first middle electrode layer 123-1, since the thickness of the first middle electrode layer 123-1 is very small, effects on the variable resistance layer 124 can be insignificant. Therefore, even when the middle electrode layer 123 includes the first middle electrode layer 123-1 and the second middle electrode layer 123-2, the same effect can be exhibited as the effect derived from the implementation shown in FIG. 2A in which the carbon layer is completely removed.

Since the first middle electrode layer 123-1 shown in FIG. 2B has a very fine thickness, the role of the middle electrode may be mainly performed by the second middle electrode layer 123-2, and the role of the first middle electrode layer 123-1 as the middle electrode may be insignificant.

In some implementations, each of the memory cells 120 includes the lower electrode layer 121, the selector layer 122, the middle electrode layer 123, the variable resistance layer 124 and the upper electrode layer 125, which are sequentially stacked. The structures of the memory cells 120 may be varied without being limited to examples as shown in FIGS. 1A and 1B as long as the memory cells 120 have data storage properties. In some implementations, at least one of the lower electrode layer 121 and the upper electrode layer 125 may be omitted. For example, when the lower electrode layer 121 is omitted, the first conductive lines 110 may perform the function of the lower electrode layer 121. When the upper electrode layer 125 is omitted, the second conductive lines 130 may perform the function of the upper electrode layer 125. In some implementations, the relative position of the variable resistance layer 124 and the selector layer 122 may be reversed. In some implementations, in addition to the layers 121, 122, 123, 124 and 125 shown in FIG. 1B, the memory cells 120 may further include one or more layers (not shown) for enhancing characteristics of the memory cells 120 or improving fabricating processes.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (e.g., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

Although one cross-point structure has been described, two or more cross-point structures may be stacked in a vertical direction perpendicular to a top surface of the substrate 100.

In some implementations, a semiconductor device can be formed as will be explained with reference to FIGS. 3A to 3G. The detailed descriptions similar to those described with reference to FIGS. 1A, 1B and 2A will be omitted. An initial lower electrode 221A, an initial selector layer 222A, a material layer 222B for a selector layer, an initial middle electrode layer 223A, an initial variable resistance layer 224A and an initial upper electrode layer 225A shown in FIG. 3A to 3F may represent layers included in a memory cell 220 before being patterned, and may be substantially the same as the lower electrode 121, the selector layer 122, the middle electrode layer 123, the variable resistance layer 124 and the upper electrode layer 125, respectively.

Figure 3A:
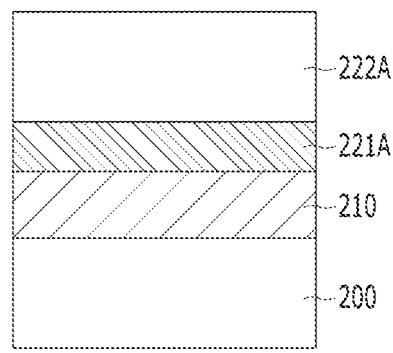
FIGS. 3A to 3G are cross-sectional views illustrating an example of a semiconductor device and a method for fabricating the semiconductor device based on some implementations of the disclosed technology.

Referring to FIG. 3A, first conductive lines 210 may be formed over a substrate 200 in which a predetermined structure is formed. For example, the first conductive lines 210 may be formed by forming a conductive layer for the first conductive lines 210 over the substrate 200 and etching the conductive layer using a mask pattern in a line shape extending in a first direction. The first conductive lines 210 may have a single-layered structure or a multi-layered structure including a conductive material.

Then, the initial lower electrode 221A and the initial selector layer 222A may be sequentially formed over the first conductive lines 210.

The initial lower electrode 221A may include various conductive materials.

The initial selector layer 222A may include an insulating material doped with a dopant. For example, the initial selector layer 222A may be formed by forming the insulating material and doping the insulating layer with the dopant by an ion implantation process.

Figure 3B:
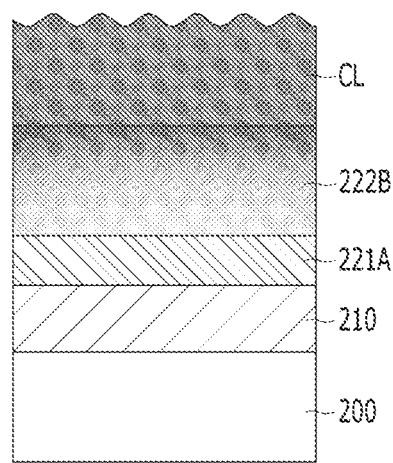

Referring to FIG. 3B, a carbon layer CL may be formed over the initial selector layer 222A. The carbon layer CL may be formed by a PVD process in consideration of diffusion of carbon into the initial selector layer 222A. In the process of depositing the carbon layer CL over the initial selector layer 222A, carbon may be diffused throughout the initial selector layer 222A. Since the carbon layer CL is formed over the initial selector layer 222A and carbon is diffused from the carbon layer CL, a carbon concentration at an upper portion of the initial selector layer 222A may be higher than a carbon concentration at a lower portion of the initial selector layer 222A. The initial selector layer 222A having carbon diffused therein may also be referred to as the material layer 222B for a selector layer.

Because the carbon is diffused into the initial selector layer 222A, an effective thickness of the initial selector layer 222A can be reduced, an initial resistance value ($R_{ini}$) and a hold current ($I_{hold}$) can be decreased and characteristics of a selector layer 222 can be improved.

Figure 3C:
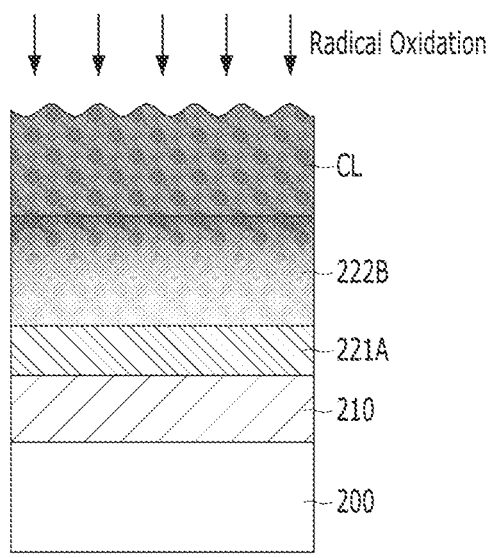

Referring to FIG. 3C, a radical oxidation process may be performed. Through the radical oxidation process, CO (gas) and $CO_2$ (gas) can be generated by a reaction between carbon (C) included in the carbon layer CL and an oxygen radical (O*), thereby removing the carbon layer CL.

The radical oxidation process may be performed under the conditions for controlling the degree of a bond between carbon (C) and the oxygen radical (O*). In some implementations, the radical oxidation process may be performed using RF power of 300 W or less at a temperature of 100-350° C. under a high vacuum of 10 mTorr$^{-1}$ or less and under a condition of maintaining $O_2$ and $H_2$ gases at a gas flow rate of 100 sccm (a measure of gas throughput (pressure times volume over time)) or less. In some implementations, the radical oxidation process may be performed by a thermal process at a temperature of 400-900° C. without using RF plasma.

As such, by the radical oxidation process, the carbon layer CL may be removed and structural defects of the initial selector layer 222A may be removed. That is, through the radical oxidation process, a reaction between the dangling bonds of the initial selector layer 222A and the oxygen radical (O*) may be performed, thereby improving the structural defects of the initial selector layer 222A.

Therefore, the radical oxidation process may be performed for a sufficient time to allow a reaction between the dangling bonds of the initial selector layer 222A and the oxygen radical (O*).

Figure 3D:
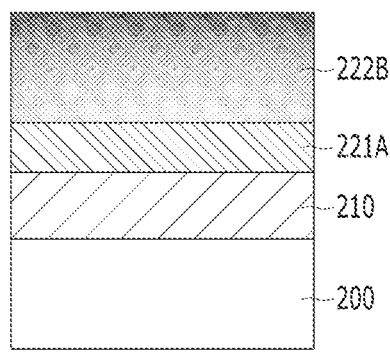

Referring to FIG. 3D, the carbon layer CL may be completely removed by the radical oxidation process and the initial selector layer 222A may be converted into the material layer 222B for the selector layer.

Since the carbon layer CL is removed by the radical oxidation process, deterioration of the variable resistance layer 224 caused by the remaining carbon layer CL can be prevented. In addition, since there is no need to perform a process for planarizing the carbon layer CL, physical stress may not be applied to the material layer 222B for the selector layer, and thus deterioration of the characteristics of the material layer 222B for the selector layer can be prevented.

Figure 3E:
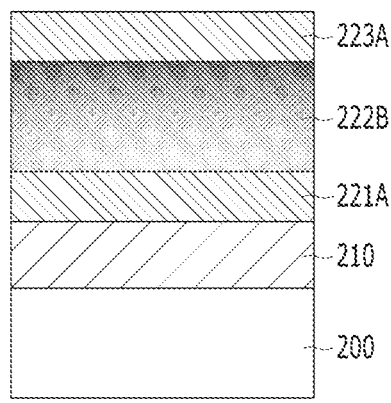

Referring to FIG. 3E, the initial middle electrode layer 223A may be formed over the material layer 222B.

The initial middle electrode layer 223A may include a single-layered structure or a multi-layered structure including a metal, or a metal nitride, or a combination thereof. The initial middle electrode layer 223A may not include carbon. For example, the initial middle electrode layer 223A may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof. In some implementations, the initial middle electrode layer 223A may include TiN.

In some implementations, the initial middle electrode layer 223A may be formed of a material that can improve the characteristics of the variable resistance layer 224. That is, since the characteristics of the material layer 222B for the selector layer can be improved by carbon diffusion in the previous process, the initial middle electrode layer 223A may be formed of a material advantageously selected in consideration of only the characteristics of the variable resistance layer 224.

Figure 3F:
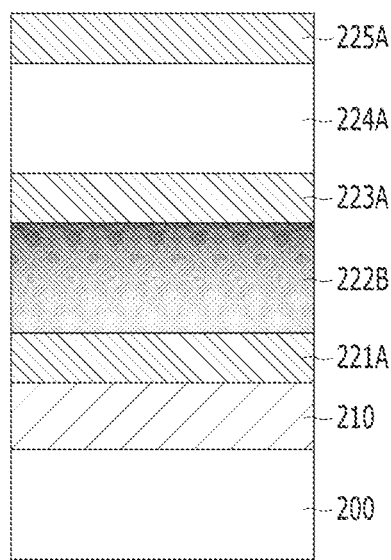

Referring to FIG. 3F, the initial variable resistance layer 224A and the initial upper electrode layer 225A may be sequentially formed over the initial middle electrode layer 223A.

In some implementations, the initial variable resistance layer 224A may include material layers forming an MTJ.

The initial upper electrode layer 225A may include various conductive materials.

Figure 3G:
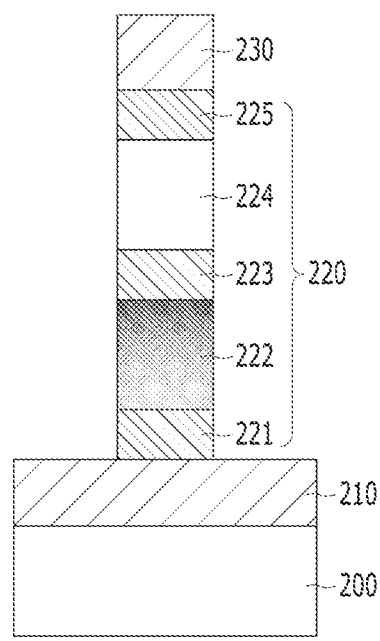

Referring to FIG. 3G, a memory cell 220 in which a lower electrode layer 221, a selector layer 222, a middle electrode layer 223, a variable resistance layer 224 and an upper electrode layer 225 are sequentially stacked may be formed by sequentially etching the initial upper electrode layer 225A, the initial variable resistance layer 224A, the initial middle electrode layer 223A, the material layer 222B for the selector layer and the initial lower electrode 221A using a hard mask pattern.

Second conductive lines 230 may be formed over the memory cell 220.

For example, the second conductive lines 230 may be formed by forming a conductive layer for forming the second conductive lines 230 over the memory cell 120 and etching the conductive layer by using a mask pattern in a line shape extending in a second direction.

Through the above-described process, a semiconductor device including the first conductive lines 210, the memory cell 220 and the second conductive lines 230 may be formed. The memory cell 220 may include the lower electrode 221, the selector layer 222, the middle electrode layer 223, the variable resistance layer 224 and the upper electrode layer 225, which are sequentially stacked. The selector layer 222 may include the insulating material doped with the dopant. The selector layer 222 may include carbon diffused throughout the selector layer 222. The carbon concentration at the upper portion of the selector layer 222 may be higher than the carbon concentration at the lower portion of the selector layer 222. The middle electrode layer 223 may include a single-layered structure or a multi-layered structure including a metal, or a metal nitride, or a combination thereof.

In some implementations, the first conductive lines 210, the memory cell 220 and the second conductive lines 230 are formed by separate processes. In other implementations, the first conductive lines 210 and material layer patterns may be formed by sequentially forming a conductive layer for forming the first conductive lines 210 and material layers for forming the memory cell 220 and etching the material layers and the conductive layer by using a mask pattern in a line shape extending in a first direction. Spaces between the first conductive lines 210 and the material layer patterns may be filled with an insulating material. Then, the second conductive lines 230 and the memory cell 220 may be formed by forming a conductive layer for forming the second conductive lines 230 over the material layer patterns and etching the conductive layer and the material layer patterns by using a mask pattern in a line shape extending in a second direction.

In some implementations, since carbon is diffused into the selector layer 222, it is possible to decrease an effective thickness of the selector layer 222, reduce an initial resistance value ($R_{ini}$) and a hold current ($I_{hold}$), and improve the switching characteristics of the selector layer 222. In addition to the improvement of the characteristics of the selector layer 222 by the carbon diffusion, since the carbon layer CL is removed before patterning the memory cell 220, it is possible to prevent carbon from being diffused into or redeposited on the variable resistance layer 224, thereby preventing deterioration of the characteristics of the variable resistance layer 224. Further, by removing the carbon layer CL by the radical oxidation process, there is no need to perform a CMP or etchback process and no physical stress is applied to the structurally unstable selector layer 222. Thus, lifting or peeling of the selector layer 222 can be prevented. Moreover, during the radical oxidation process, a bond between the dangling bond in the selector layer 222 and the oxygen radical (O*) can be activated, thereby improving structural stability of the selector layer 222.

Figure 4A:
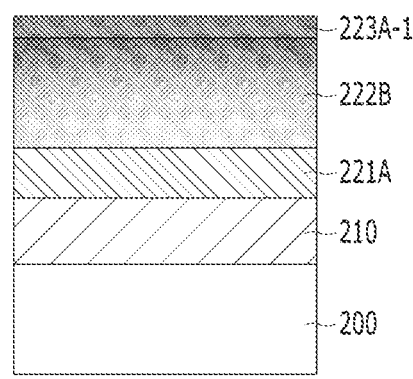
FIGS. 4A to 4C are cross-sectional views illustrating another example of a semiconductor device and a method for fabricating the semiconductor device based on some implementations of the disclosed technology.
Figure 4B:
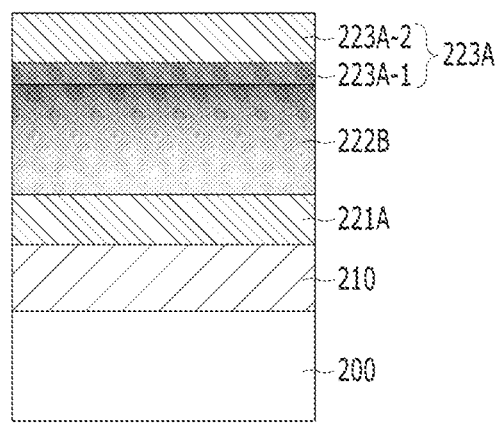
Figure 4C:
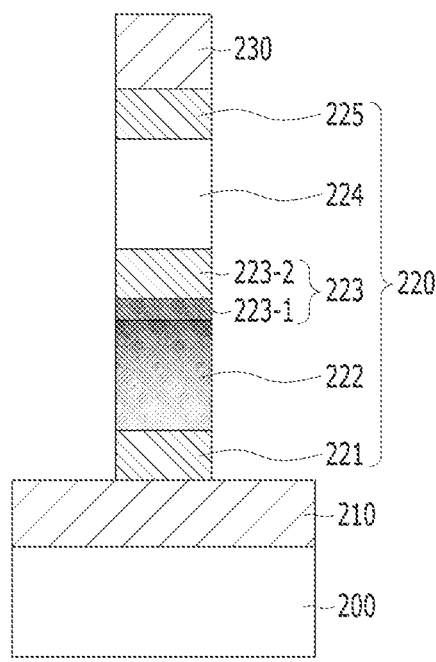

FIGS. 4A to 4C are cross-sectional views illustrating another example of a semiconductor device and a method for fabricating the semiconductor device based on some implementations of the disclosed technology.

The implementation shown in FIG. 4A to 4C is similar to the implementation shown in FIG. 3A to 3G except that a carbon layer CL is not completely removed and remains with a very thin thickness after a radical oxidation process to form a first initial middle electrode layer 223A-1. The detailed descriptions similar to those described with reference to FIGS. 3A to 3G will be omitted.

Referring to FIG. 4A, first conductive lines 210, an initial lower electrode 221A, a material layer 222B for a selector layer and a first initial middle electrode layer 223A-1 may be formed over a substrate 200 through a process similar to those described with reference to FIGS. 3A to 3C. However, unlike the implementation shown in FIGS. 3A to 3C, the carbon layer CL may not be completely removed and remain with a very thin thickness. The carbon layer CL remaining over the material layer 222B may be referred to as the first initial middle electrode layer 223A-1.

The material layer 222B may include carbon diffused throughout the material layer 222B. A carbon concentration at an upper portion of the material layer 222B may be higher than a carbon concentration at a lower portion of the material layer 222B.

The first initial middle electrode layer 223A-1 may include carbon. The first initial middle electrode layer 223A-1 may not include a conductive material other than carbon. The first initial middle electrode layer 223A-1 may have a thickness such that, even if carbon remains as a film, carbon does not move to a variable resistance layer 224 or is not redeposited on the variable resistance layer 224. In some implementations, the first initial middle electrode layer 223A-1 may have a thickness greater than 0 nm and less than or equal to 5 nm.

Referring to FIG. 4B, a second initial middle electrode layer 223A-2 may be formed over the first initial middle electrode layer 223A-1.

The second initial middle electrode layer 223A-2 may include a single-layered structure or a multi-layered structure including a metal, or a metal nitride, or a combination thereof. The second initial middle electrode layer 223A-2 may not include carbon. For example, the second initial middle electrode layer 223A-2 tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN), or a combination thereof. In some implementations, the second initial middle electrode layer 223A-2 may include TiN.

Referring to FIG. 4C, a memory cell 220, in which a lower electrode 221, a selector layer 222, a first middle electrode layer 223-1, a second middle electrode layer 223-2, a variable resistance layer 224 and an upper electrode layer 225 are sequentially stacked, may be formed by etching the initial upper electrode layer 225A, the initial variable resistance layer 224A, the second initial middle electrode layer 223A-2, the first initial middle electrode layer 223A-1, the material layer 222B for the selector layer, and the initial lower electrode layer 221A by using a hard mask pattern.

Second conductive lines 230 may be formed over the memory cell 220.

Through the above-described process, a semiconductor device including the first conductive lines 210, the memory cell 220 and the second conductive lines 230 may be formed. The memory cell 220 may include the lower electrode 221, the selector layer 222, the middle electrode layer 223, the variable resistance layer 224 and the upper electrode layer 225, which are sequentially stacked. The selector layer 222 may include carbon diffused throughout the selector layer 222. The carbon concentration at the upper portion of the selector layer 222 may be higher than the carbon concentration at the lower portion of the selector layer 222. The middle electrode layer 223 may include the first middle electrode layer 223-1 and the second middle electrode layer 223-2. The first middle electrode layer 223-1 may include carbon and may have a thickness greater than 0 nm and less than or equal to 5 nm. The second middle electrode layer 223-2 may include a single-layered structure or a multi-layered structure including a metal, or a metal nitride, or a combination thereof.

As shown in FIGS. 4A to 4C, although the first middle electrode layer 223-1 including carbon exists, it has a very thin thickness, so that an influence on the variable resistance layer 224 may be insignificant. Thus, the same effect as the effect derived from the implementation shown in FIGS. 3A to 3G can be achieved without deterioration of the characteristics of the variable resistance layer 224 caused by carbon diffusion or redeposition.

As discussed above, the selector layer 222 may be disposed below the variable resistance layer 224. However, relative positions of the selector layer 222 and the variable resistance layer 224 may be reversed as will be discussed below with reference to FIGS. 5A and 5B.

Figure 5A:
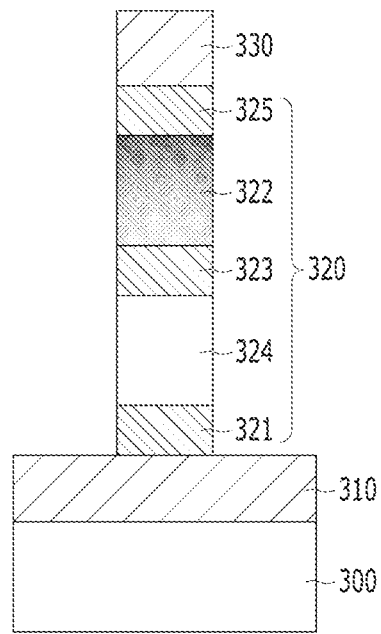
FIGS. 5A and 5B illustrate another example of a semiconductor device based on some implementations of the disclosed technology.
Figure 5B:
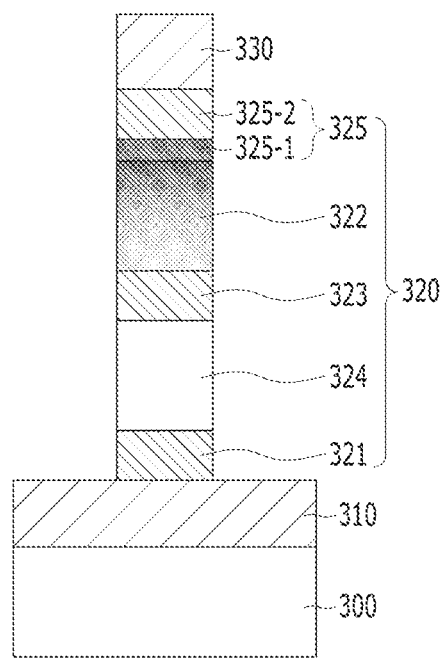

FIGS. 5A and 5B illustrate another example of a semiconductor device based on some implementations of the disclosed technology. The semiconductor device may be formed by a similar process to those described with reference to FIGS. 3A to 3G except that a material layer for a lower electrode layer 321, a material layer for a variable resistance layer 324, a material layer for a middle electrode layer 323, a material layer for a selector layer 322 and a carbon layer CL are sequentially formed, carbon is diffused into the material layer for the selector layer 322, and the carbon layer CL is completely removed by the radical oxidation process (see, FIG. 5A) or the carbon layer CL is not completely removed and remains with a very thin thickness (see, FIG. 5B).

Referring to FIG. 5A, the semiconductor device may include first conductive lines 310, a memory cell 320 and second conductive lines 330. The memory cell 320 may include the lower electrode 321, the variable resistance layer 324, the middle electrode layer 323, the selector layer 322 and the upper electrode layer 325, which are sequentially stacked.

The selector layer 322 may include carbon diffused into the selector layer 322. A carbon concentration at an upper portion of the selector layer 322 may be higher than a carbon concentration at a lower portion of the selector layer 322. The upper electrode layer 325 may include a single-layered structure or a multi-layered structure including a metal, or a metal nitride, or a combination thereof. The upper electrode layer 325 may not include carbon.

The semiconductor device shown in FIG. 5A may be formed by: sequentially forming the material layer for the lower electrode layer 321, the material layer for the variable resistance layer 324, the material layer for the middle electrode layer 323, the material layer for the selector layer 322 and the carbon layer CL to diffuse carbon into the material layer for the selector layer 322; completely removing the carbon layer CL by a radical oxidation process, forming the material layer for the upper electrode layer 325; performing a patterning process to form the memory cell 320; and forming the second conductive lines 330.

The semiconductor device shown in FIG. 5B is similar to the semiconductor device shown in FIG. 5A except that the carbon layer CL is not completely removed and remains with a very thin thickness by the radical oxidation process to form a first upper electrode layer 325-1.

Referring to FIG. 5B, the semiconductor device may include first conductive lines 310, a memory cell 320 and second conductive lines 330. The memory cell 320 may include a lower electrode layer 321, a variable resistance layer 324, a middle electrode layer 323, a selector layer 322 and an upper electrode layer 325 which are sequentially stacked.

The selector layer 322 may include carbon diffused into the selector layer 322. A carbon concentration at an upper portion of the selector layer 322 may be higher than a carbon concentration at a lower portion of the selector layer 322. The upper electrode layer 325 may include the first upper electrode layer 325-1 and a second upper electrode layer 325-2. The first upper electrode layer 325-1 may include carbon and may have a thickness greater than 0 nm and less than or equal to 5 nm. The first upper electrode layer 325-1 may not include a conductive material other than carbon. The second upper electrode layer 325-2 may include a single-layered structure or a multi-layered structure including a metal, or a metal nitride, or a combination thereof. The second upper electrode layer 325-2 may not include carbon.

As shown in FIGS. 5A and 5B, since carbon is diffused into the selector layer 322, it is possible to decrease an effective thickness of the selector layer 322, reduce an initial resistance value ($R_{ini}$) and a hold current ($I_{hold}$), and improve the switching characteristics of the selector layer 322. Although the first middle electrode layer 323-1 including carbon exists, it has a very thin thickness, so that an influence on the variable resistance layer 324 may be insignificant. Accordingly, like the implementation shown in FIG. 5A, it is possible to prevent carbon from being diffused into or redeposited on the variable resistance layer 324, thereby preventing deterioration of the characteristics of the variable resistance layer 324. Further, there is no need to perform a CMP or etchback process and no physical stress is applied to the structurally unstable selector layer 322. Thus, lifting or peeling of the selector layer 322 can be prevented. Moreover, during the radical oxidation process, a bond between the dangling bond in the selector layer 322 and the oxygen radical (O*) can be activated, thereby improving structural stability of the selector layer 322.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor device, comprising:
   a first electrode layer;
   a second electrode layer disposed over the first electrode layer and spaced apart from the first electrode layer; and
   a selector layer disposed between the first electrode layer and the second electrode layer and including an insulating material that contains at least a dopant and carbon;
   wherein a carbon concentration at a first portion of the selector layer adjacent to the second electrode layer is higher than a carbon concentration at a second portion of the selector layer adjacent to the first electrode layer.

2. The semiconductor device according to claim 1, wherein the second electrode layer includes a conductive material without containing carbon.

3. The semiconductor device according to claim 1, wherein the second electrode layer includes a first sub electrode layer disposed adjacent to the selector layer and including carbon and a second sub electrode layer disposed over the first sub electrode layer and including at least one of a metal or a metal nitride.

4. The semiconductor device according to claim 3, wherein the first sub electrode layer has a thickness greater than 0 nm and less than or equal to 5 nm.

5. The semiconductor device according to claim 1, wherein the insulating material in the selector layer includes at least one of silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, and
   wherein the dopant includes at least one of boron (B), nitrogen (N), carbon (C), phosphorous (P), arsenic (As), aluminum (Al), silicon (Si), or germanium (Ge).

6. The semiconductor device according to claim 1, wherein the second electrode layer includes at least one of tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), or tantalum aluminum nitride (TaAlN).

7. The semiconductor device according to claim 1, further comprising a variable resistance layer configured to exhibit different resistance states and disposed over the second electrode layer or under the first electrode layer.

8. The semiconductor device according to claim 7, wherein the variable resistance layer is disposed over the second electrode layer, and wherein the semiconductor device further includes a third electrode layer disposed over the variable resistance layer.

9. The semiconductor device according to claim 7, wherein the variable resistance layer is disposed under the first electrode layer, and wherein the semiconductor device further includes a third electrode layer disposed under the variable resistance layer.

10. The semiconductor device according to claim 1, wherein the selector layer includes a bond formed by a reaction between a dangling bond and an oxygen radical.

* * * * *